US012345658B2

United States Patent
Romanovsky et al.

(10) Patent No.: US 12,345,658 B2
(45) Date of Patent: Jul. 1, 2025

(54) LARGE-PARTICLE MONITORING WITH LASER POWER CONTROL FOR DEFECT INSPECTION

(71) Applicant: KLA Corporation, Milpitas, CA (US)

(72) Inventors: Anatoly Romanovsky, Palo Alto, CA (US); Zhiwei Xu, Sunnyvale, CA (US); Yury Yuditsky, Mountain View, CA (US); Yifeng Cui, Fremont, CA (US); Mandar Paranjape, San Jose, CA (US)

(73) Assignee: KLA CORPORATION, Milpitas, CA (US)

( * ) Notice: Subject to any disclaimer, the term of this patent is extended or adjusted under 35 U.S.C. 154(b) by 457 days.

(21) Appl. No.: 17/224,913

(22) Filed: Apr. 7, 2021

(65) Prior Publication Data

US 2022/0091047 A1   Mar. 24, 2022

Related U.S. Application Data

(60) Provisional application No. 63/082,484, filed on Sep. 24, 2020.

(51) Int. Cl.
| | |
|---|---|
| *G01N 21/95* | (2006.01) |
| *G01N 21/88* | (2006.01) |
| *H01L 21/66* | (2006.01) |

(52) U.S. Cl.
CPC ..... *G01N 21/9501* (2013.01); *G01N 21/8806* (2013.01); *H01L 22/12* (2013.01); *G01N 2021/8835* (2013.01)

(58) Field of Classification Search
CPC .......... G01N 21/9501; G01N 21/8806; G01N 2021/8835; H01L 22/12
See application file for complete search history.

(56) References Cited

U.S. PATENT DOCUMENTS

| | | | |
|---|---|---|---|
| 7,436,508 | B2 | 10/2008 | Wolters et al. |
| 8,305,568 | B2 | 11/2012 | Matsui et al. |

(Continued)

FOREIGN PATENT DOCUMENTS

| | | |
|---|---|---|
| KR | 20200059624 A | 5/2020 |
| TW | 201734428 A | 10/2017 |

(Continued)

OTHER PUBLICATIONS

PCT/US2021/048807, International Search Report, Dec. 1, 2021.

(Continued)

*Primary Examiner* — Hung V Nguyen
(74) *Attorney, Agent, or Firm* — Huse IP Law

(57) ABSTRACT

A semiconductor wafer is inspected using a main laser beam and a secondary laser beam. The secondary laser beam leads the main laser beam and has lower power than the main laser beam. Using the secondary laser beam, a particle is detected on the semiconductor wafer having a size that satisfies a threshold. In response to detecting the particle, the power of the main laser beam and the power of the secondary laser beam are reduced. The particle passes through the main laser beam with the main laser beam at reduced power. After the particle has passed through the main laser beam with the main laser beam at the reduced power, the power of the main laser beam and the power of the secondary laser beam are restored in a controlled manner that is slower than a single step.

32 Claims, 6 Drawing Sheets

(56) References Cited

U.S. PATENT DOCUMENTS

| | | | |
|---|---|---|---|
| 8,755,044 B2* | 6/2014 | Reich | G01N 21/9501 |
| | | | 356/337 |
| 9,182,358 B2 | 11/2015 | Xu et al. | |
| 10,324,045 B2* | 6/2019 | Cui | G01N 21/9501 |
| 10,429,289 B2 | 10/2019 | Knox et al. | |
| 10,551,320 B2 | 2/2020 | Haller | |
| 10,782,247 B2 | 9/2020 | Kim et al. | |
| 10,989,755 B2 | 4/2021 | Henley | |
| 11,143,600 B2* | 10/2021 | Honda | G01N 21/8901 |
| 2013/0050689 A1 | 2/2013 | Reich et al. | |
| 2018/0038803 A1 | 2/2018 | Cui et al. | |
| 2021/0050700 A1 | 2/2021 | Paranjape et al. | |

FOREIGN PATENT DOCUMENTS

| | | |
|---|---|---|
| TW | 201832304 A | 9/2018 |
| TW | 201907178 A | 2/2019 |
| WO | 2004001382 A3 | 5/2004 |

OTHER PUBLICATIONS

PCT/US2021/048807, Written Opinion of the International Searching Authority, Dec. 1, 2021.
TW Intellectual Property Office, Office Action for TW Pat. App. No. 110128469, Oct. 8, 2024.

* cited by examiner

US 12,345,658 B2

LARGE-PARTICLE MONITORING WITH LASER POWER CONTROL FOR DEFECT INSPECTION

RELATED APPLICATION

This application claims priority to U.S. Provisional Patent Application No. 63/082,484, filed on Sep. 24, 2020, which is incorporated by reference in its entirety for all purposes.

TECHNICAL FIELD

This disclosure relates to laser power modulation, and more specifically to laser power modulation for large-particle monitoring.

BACKGROUND

As semiconductor design rules tighten, the sizes of defects shrink accordingly. A defect inspection tool, which is also referred to as a particle inspection tool or simply an inspection tool, should be capable of detecting small particles in advanced design layers (e.g., design layers with the tightest design rules). For laser-scattering-based inspection tools, laser power-density requirements will keep increasing to allow detection of smaller and smaller particles. New inspection tools therefore have higher laser power densities and smaller focus-spot sizes.

Laser heating of particle defects, however, can cause the particles to explode (i.e., can cause particle ablation). Increasing laser power density reduces the threshold size above which particle ablation occurs. Particle ablation may break one large particle into hundreds of smaller particles in the surrounding area on a semiconductor wafer, causing particle contamination. Higher laser power density may also damage films deposited on the wafer and possibly the wafer itself (e.g., when high power density is combined with a long exposure time). These problems may be mitigated by dynamically adjusting laser power during wafer inspection. Dynamic adjustment of laser power may be referred to as laser power modulation (LPM).

SUMMARY

Accordingly, there is a need for improved methods and systems for laser power modulation during wafer inspection.

In some embodiments, a method includes inspecting a semiconductor wafer using a main laser beam and a secondary laser beam. The secondary laser beam leads the main laser beam and has lower power than the main laser beam. The method also includes detecting, using the secondary laser beam, a particle on the semiconductor wafer having a size that satisfies a threshold and, in response to detecting the particle, reducing the power of the main laser beam and the power of the secondary laser beam. The particle passes through the main laser beam with the main laser beam at reduced power. The method further includes, after the particle has passed through the main laser beam with the main laser beam at the reduced power, restoring the power of the main laser beam and the power of the secondary laser beam in a controlled manner that is slower than a single step.

In some embodiments, a system includes optics to provide a main laser beam and a secondary laser beam to a semiconductor wafer. The secondary laser beam is to lead the main laser beam and has lower power than the main laser beam. The system also includes a detector to detect, using the secondary laser beam, a particle on the semiconductor wafer having a size that satisfies a threshold. The optics include a modulator to cause, in response to detecting the particle, the power of the main laser beam and the power of the secondary laser beam to be reduced when the particle passes through the main laser beam, and the power of the main laser beam and the power of the secondary laser beam to be restored in a controlled manner that is slower than a single step after the particle has passed through the main laser beam.

BRIEF DESCRIPTION OF THE DRAWINGS

For a better understanding of the various described implementations, reference should be made to the Detailed Description below, in conjunction with the following drawings. The drawings may not be to scale.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
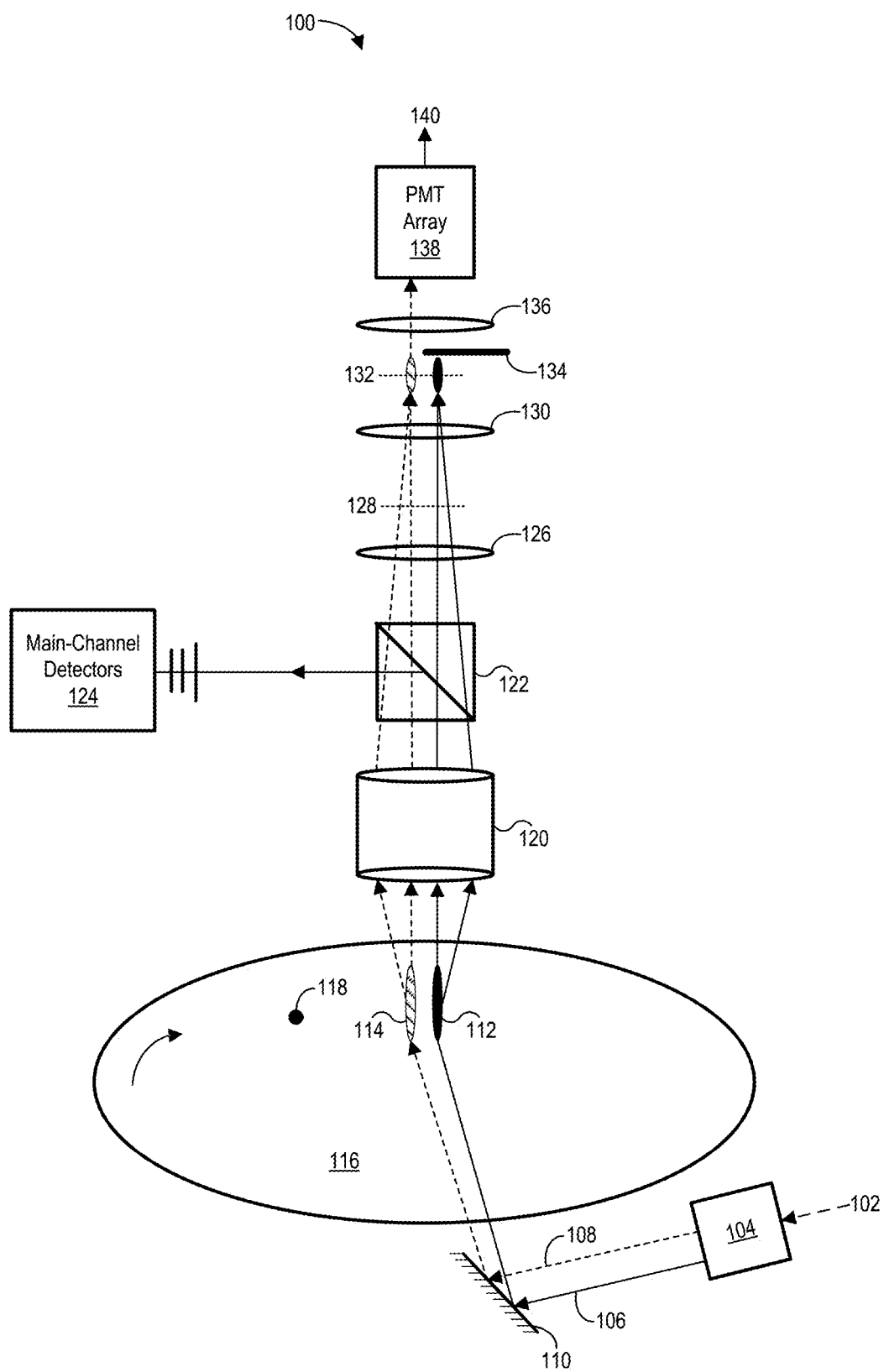
FIG. 1 is a diagram of components of a system for inspecting a semiconductor wafer in accordance with some embodiments.
Figure 5:
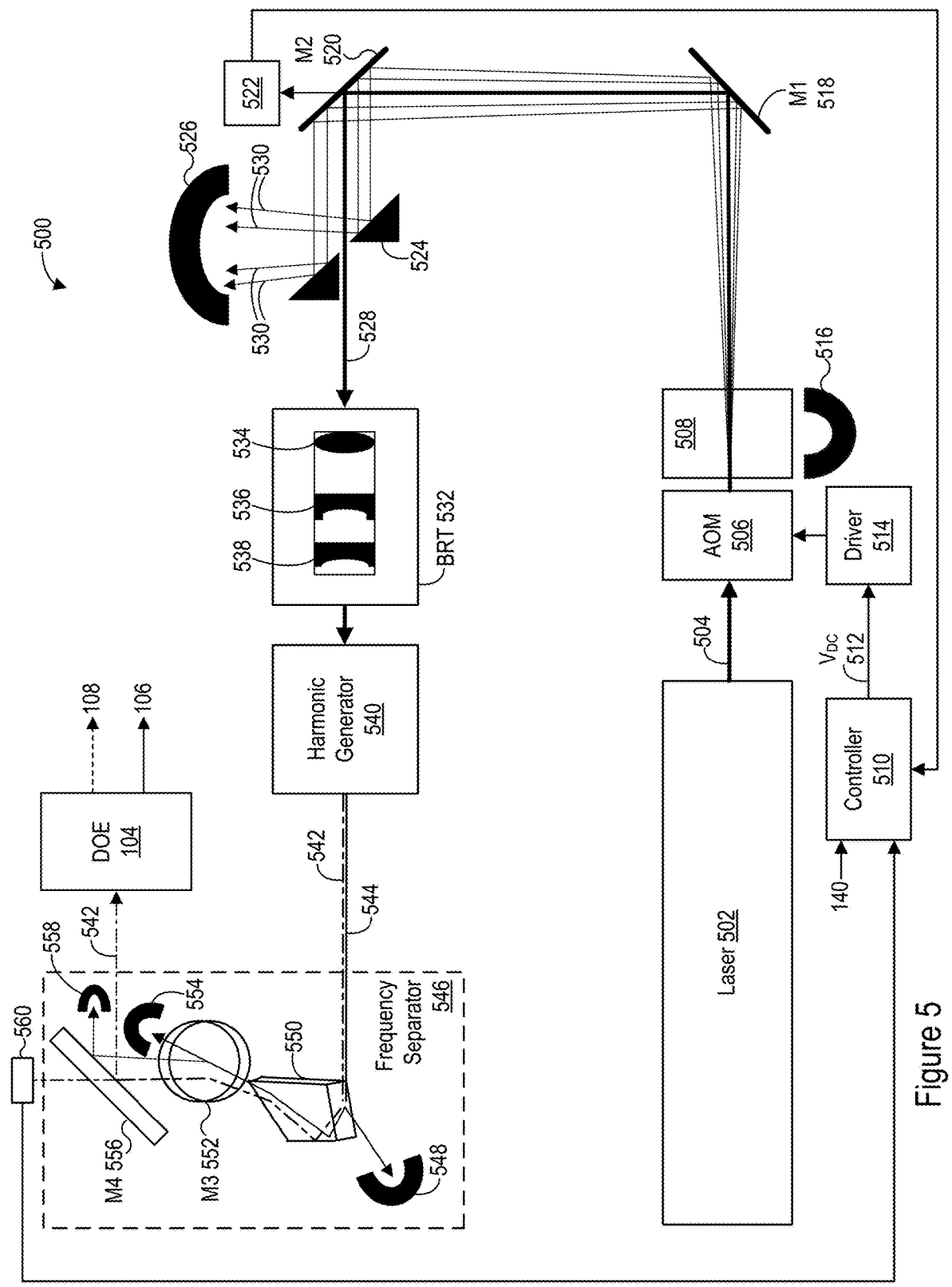
FIG. 5 is a diagram showing a laser-beam power-modulation system with an acousto-optic modulator (AOM) in accordance with some embodiments.

FIG. 1 is a diagram of components of a system 100 for inspecting a semiconductor wafer 116 in accordance with some embodiments. The system 100 uses a main laser beam ("main beam") 106 and a secondary laser beam ("secondary beam") 108 to inspect a semiconductor wafer 116. The secondary beam 108, which has lower power than the main beam 106, may also be referred to as an LPM beam. Illumination optics in the system 100, including a mirror 110 and other optical components (which are not shown in FIG. 1 for simplicity), provide the main beam 106 and the secondary beam 108 to the wafer 116. (Examples of other optical components in the illumination optics are shown in FIG. 5, as discussed below). The main beam 106 and the secondary beam 108 form respective spots 112 and 114 on the wafer 116. The secondary beam 108 leads (i.e., precedes) the main beam 106, such that a particle 118 on the wafer 116 passes through the secondary beam 108 (i.e., through the spot 114) before passing through the main beam 106 (i.e., through the spot 112). The wafer 116 may be rotated during inspection (e.g., using a rotating chuck, not shown, on which the wafer 116 is mounted), such that rotation of the wafer 116 causes the particle 118 to pass through the secondary beam 108 before passing through the main beam 106.

Light scattered from the respective spots 112 and 114 are collected by an imaging objective 120 and provided to a beam splitter 122. The beam splitter 122 directs the majority of the beam power (e.g., 98% of the beam power) for the main beam 106 and secondary beam 108 (as scattered from the spots 112 and 114) to main-channel detectors 124, which detect defects on the wafer 116. The light from the secondary beam 108, as directed to the main-channel detectors 124, is offset from the light from the main beam 106 that is direct to the main-channel detectors 124. The aperture of the main-channel detectors 124 may be positioned to allow the main-channel detectors 124 to receive light from the main beam 106 while rejecting light from the secondary beam 108. The main-channel detectors 124 detect defects on the wafer 116, including defects that are small enough not to be ablated by the main beam 106.

The beam splitter 122 transmits some of the beam power (e.g., 2% of the beam power) for the main beam 106 and secondary beam 108 (as scattered from the spots 112 and 114) toward a photo-multiplier tube (PMT) or PMT array 138 (or another detector). Lenses 126, 130, and 136 focus light from the secondary beam 108, as transmitted by the beam splitter 122, onto the PMT or PMT array 138. The light may pass through a pupil plane 128 between the lenses 126 and 130 and through a wafer-image plane 132 between the lenses 130 and 136. A beam-blocking mask 134 (e.g., positioned between the lenses 130 and 136) blocks light from the main beam 106, thus preventing light from the main beam 106 from reaching the PMT or PMT array 138.

The imaging objective 120; beam splitter 122; lenses 126, 130, and 136; and beam-blocking mask 134 at least partially compose collection optics for the system 100. The collection optics may include other optical elements, which are not shown for simplicity.

The power of the secondary beam 108 is sufficient to allow the PMT or PMT array 138 to detect particles, such as the particle 118, that are large enough to be at risk of ablation by the main beam 106 (i.e., particles having a size that satisfies a threshold) before such particles pass through the main beam 106. The power of the secondary beam 108 is low enough, however, to prevent the secondary beam 108 from ablating large particles itself. The main beam 106 has higher power than the secondary beam 108 to allow it to detect smaller defects that would not be ablated by the main beam 106 and might not be detected using the secondary beam 108. Information from the PMT or PMT array 138 indicating the presence of a large particle at risk of ablation by the main beam 106 is used to lower the power of the main beam 106 until the large particle has passed through the main beam 106, thus avoiding ablation. For example, the PMT or PMT array 138 asserts a signal 140 in response to detection of a large particle at risk of ablation by the main beam 106 (i.e., a particle having a size that satisfies a threshold). The power of the main beam 106 may be temporarily lowered in response to assertion of the signal 140.

In some embodiments, the illumination optics in the system 100 include a diffractive optical element (DOE) 104 (or other beam splitter) that splits a third laser beam 102 into the main beam 106 and secondary beam 108. As a result, the main beam 106 and the secondary beam 108 may have similar beam sizes and intensity profiles.

Figure 2:
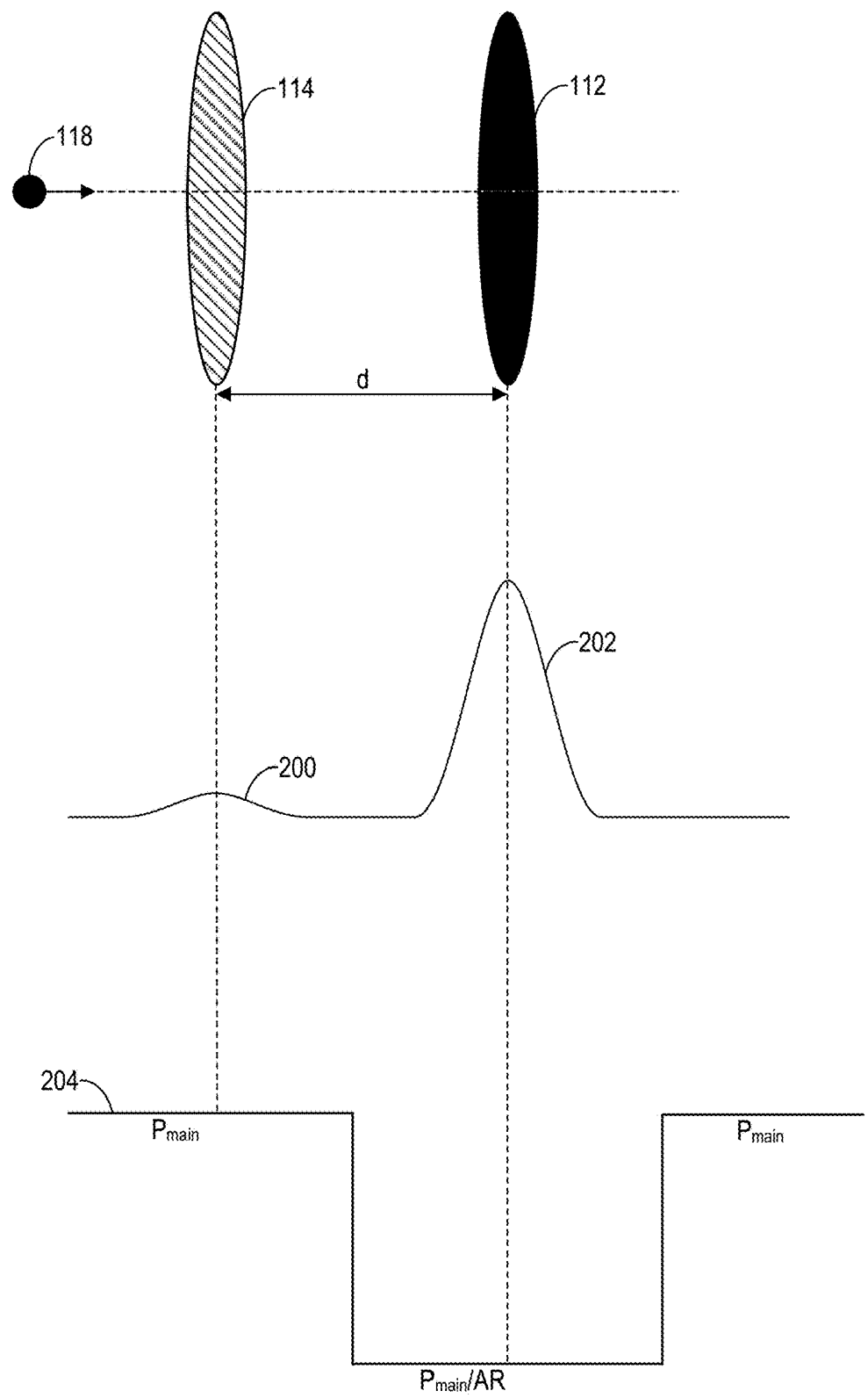
FIG. 2 shows the positions of the spot of a secondary beam and the spot of a main beam relative to a particle, main-beam and secondary-beam signals for detecting the particle, and step-wise beam-power reduction and restoration to avoid ablating the particle, in accordance with some embodiments.

FIG. 2 shows the positions of the spot 114 of the secondary beam 108 and the spot 112 of the main beam 106 relative to the particle 118. The spot 114 leads (i.e., precedes) the spot 112 by a distance d. The distance d is, for example, in the range of 100-150 um. The particle 118 will pass through the spot 114 first and then will pass through the spot 112 the distance d later. Passage of the particle 118 through the spot 114 results in a signal 200 (i.e., a secondary-beam signal) indicating the presence of the particle 118. The secondary beam 108 has sufficient power to detect the particle 118 but not to ablate the particle 118, so passage of the particle 118 through the spot 114 does not result in ablation of the particle 118. In the absence of attenuation of the power of the main beam 106, passage of the particle 118 through the spot 112 results in a signal 202 (i.e., a main-beam signal) indicating the presence of the particle 118. The signal 202 is larger than the signal 200 because the power of the main beam 106 is higher than the power of the secondary beam 108. The power of the main beam 106 is sufficient not only to detect the particle 118 but also to ablate the particle 118, which would cause additional contamination of the wafer 116 (FIG. 1).

To avoid this ablation, the power 204 of the main beam 106 is reduced (i.e., attenuated) from a value $P_{main}$, which is the default power of the main beam 106 in the absence of detection of a particle having a size sufficient to result in ablation, to $P_{main}/AR$, where AR is the attenuation ratio (i.e., the factor by which the power 204 is reduced). The attenuation ratio AR may correspond to (e.g., equal) the ratio between $P_{main}$ and $P_{secondary}$, where $P_{secondary}$ is the default power of the secondary beam 108 (e.g., $AR = P_{main}/P_{secondary}$). The power of the main beam 106 thus may be attenuated from $P_{main}$ to $P_{secondary}$ to avoid ablating the particle 118. The value of $P_{secondary}$ is chosen to allow maximum particle detection without causing particle ablation, and is thus a desirable power to which to reduce the power of the main beam 106 in the presence of a large particle. In the example of FIG. 2, the power 204 of the main beam 106 is reduced from $P_{main}$ to $P_{main}/AR$ in a single step before the particle 118 reaches the spot 112, is maintained at the reduced power $P_{main}/AR$ while the particle 118 traverses the spot 112, and is restored from $P_{main}/AR$ to $P_{main}$ in a single step after the particle 118 has traversed the spot 112. The power 204 is thus reduced from a first power level to a second power level, maintained at the reduced power level while the particle 118 traverses the spot 112, and then restored to the first power level. In some embodiments, the power 204 of the main beam 106 is maintained at the reduced power $P_{main}/AR$ for a preset period of time (i.e., a preset duration) sufficient to allow the particle 118 to traverse the spot 112.

Because the main beam 106 and secondary beam 108 are generated by splitting the third beam 102 (FIG. 1) in accordance with some embodiments, the power of the main beam 106 may be reduced from $P_{main}$ to $P_{main}/AR$ by attenuating the power of the third beam 102 accordingly (i.e., by modulating the third beam 102 to reduce its power). Attenuating the power of the third beam 102 also reduces the power of the secondary beam 108. The power of the secondary beam 108 thus may be reduced from $P_{secondary}$ to $P_{secondary}/AR$ at the same time that the power of the main beam 106 is reduced to $P_{main}/AR$, and is restored to $P_{secondary}$ at the same time that the power of the main beam 106 is restored to $P_{main}$.

FIG. 2 shows a single particle 118. Detection of the single particle 118 is referred to as a primary trigger. The primary trigger causes a triggered state in which a modulator (e.g., AOM 506, FIG. 5) reduces the power of the main beam 106 from $P_{main}$ to $P_{main}/AR$ and reduces the power of the secondary beam 108 from $P_{secondary}$ to $P_{secondary}/AR$. Multiple large particles may be positioned near each other, such that a second large particle may pass through the spot 114 of the secondary beam 108 during the triggered state. The second large particle may not reach the spot 112 of the main beam 106, however, until after the triggered state has ended, when the power of the main beam 106 has been restored from $P_{main}/AR$ to $P_{main}$, in which case the second particle would be ablated. It is therefore desirable to be able to detect this second particle using the secondary beam 108 in the second state. Such detection is referred to as a secondary trigger, which extends the triggered state such that the modulator maintains the main beam 106 with the reduced power $P_{main}/AR$ while the second particle passes through the main beam 106 (e.g., for a preset duration) and maintains the secondary beam 108 accordingly. Detecting this second particle is difficult, however, because the reduced power $P_{secondary}/AR$ of the secondary beam 108 during the triggered state may not be sufficient to detect the second particle. Compounding this problem is the increasing laser power density of inspection tools to allow detection of ever smaller particles.

Figure 3:
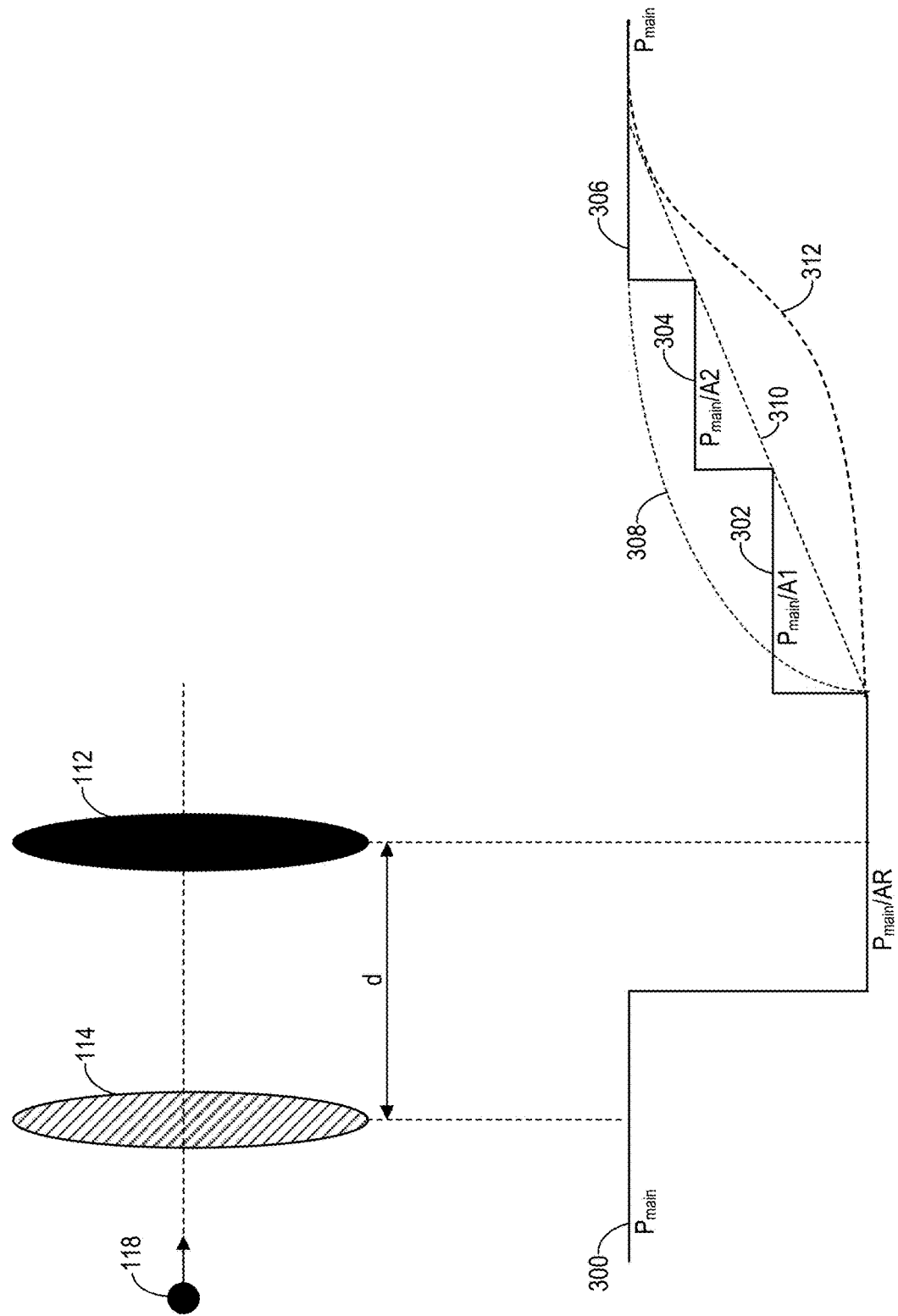
FIG. 3 shows various ways in which the power of the main beam and the power of the secondary beam may be restored in a controlled manner that is slower than a single step, in accordance with some embodiments.

This problem may be at least partially mitigated by restoring the power of the main beam 106 and the power of the secondary beam 108 in a controlled manner that is slower than a single step. FIG. 3 shows various ways in which the power 300 of the main beam 106 may be restored in such a controlled manner in accordance with some embodiments, with the power of the secondary beam 108 being restored accordingly. In some embodiments, the power 300 of the main beam 106 (and accordingly, the power of the secondary beam 108) is restored in a series of steps 302, 304, and 306. Each step 302, 304, and 306 corresponds to a distinct power level. While FIG. 3 shows 3 steps (i.e., with two intermediate steps 302 and 304), the number of steps may be fewer (i.e., may be two steps) or greater (e.g., 3 to 7 steps, or 5 to 7 steps). The first step 302 has an attenuation ratio A1 that is less than AR: the power of the main beam 106 at the first step 302 is $P_{main}/A1$ (and the power of the secondary beam 108 is $P_{secondary}/A1$). The second step 304 has an attenuation ratio A2 that is less than A1: the power of the main beam 106 at the second step 304 is $P_{main}/A2$ (and the power of the secondary beam 108 is $P_{secondary}/A2$). At the third step 306 (or more generally, the final step), the power of the main beam 106 is fully restored to $P_{main}$ (and the power of the secondary beam 108 is fully restored to $P_{secondary}$). The value of AR is, for example, in the range of 100-400. The value of A1 is, for example, in the range of 20-50. The value of A2 is, for example, in the range of 2-10. The duration for which the power 300 is held at $P_{main}/AR$ (and the power of the secondary beam 108 is held at $P_{secondary}/AR$) is, for example, a preset duration in the range of 300-400 us or 400-500 us (e.g., depending on the spin speed of the wafer 116). The duration of each intermediate step 302 and 304 is, for example, a preset duration in the range of 300-400 us.

In some embodiments, the power 300 of the main beam 106 (and accordingly, the power of the secondary beam 108) is restored by ramping up the power of the main beam 106 and the secondary beam 108 in a substantially smooth curve (e.g., smooth to within the available resolution), such as curve 308 or 312. In some embodiments, the power 300 of the main beam 106 (and accordingly, the power of the secondary beam 108) is restored by ramping up the power of the main beam 106 and the secondary beam 108 in a substantially linear ramp 310 (e.g., linear to within the available resolution).

Figure 4:
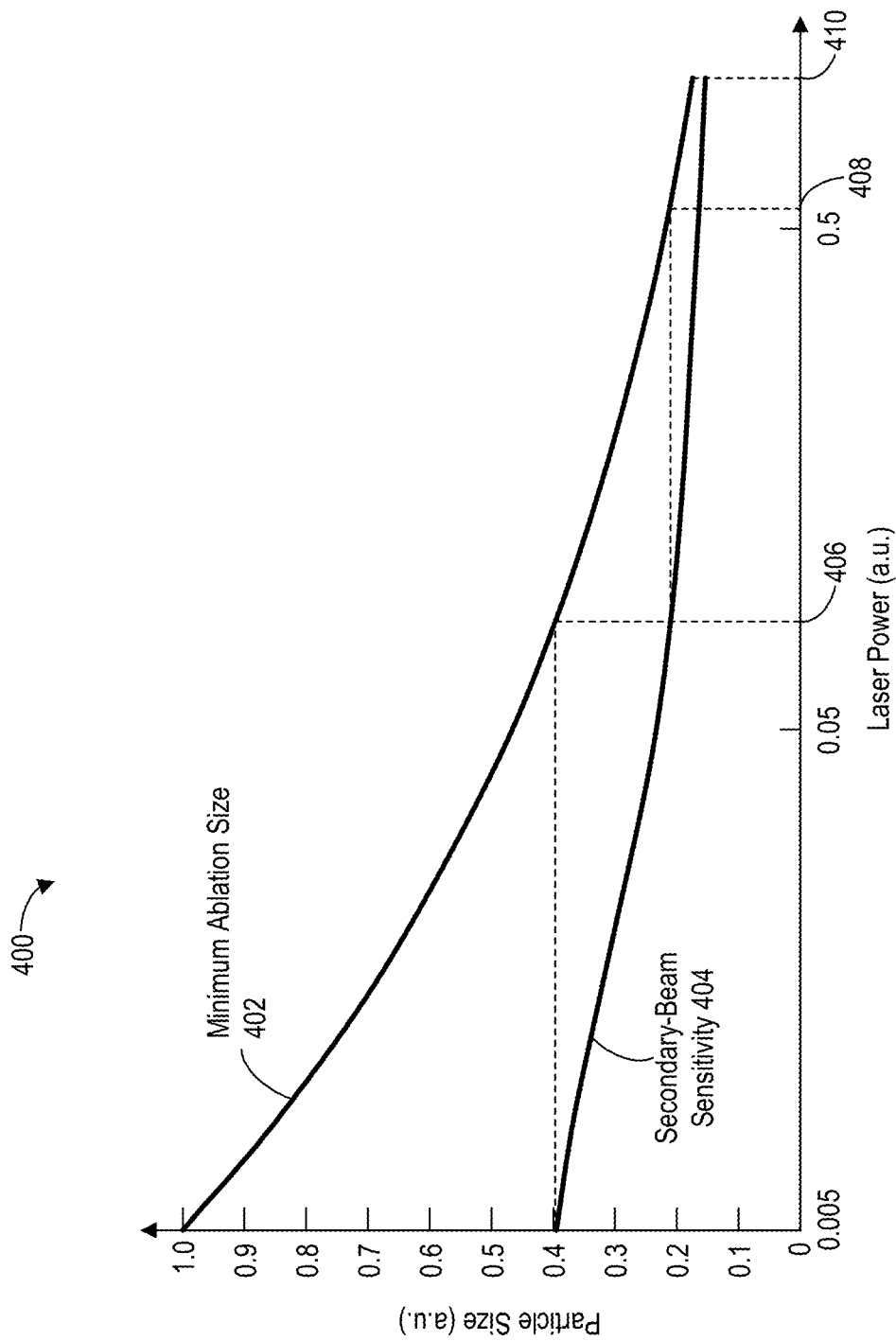
FIG. 4 is a graph showing modeled minimum ablation size and secondary-beam sensitivity versus laser power.

FIG. 4 is a graph 400 that illustrates the principle behind the controlled power restoration of FIG. 3. The graph 400 shows the modeled minimum ablation size 402 (i.e., the minimum particle size that will result in ablation) and the modeled secondary-beam sensitivity 404 (i.e., the minimum particle size that can be detected using the secondary beam 108) versus laser power, for arbitrary units ("a.u.") of particle size and laser power. The x-axis, which gives laser power, has a logarithmic scale, while the y-axis, which gives particle size, has a linear scale. The controlled power restoration of FIG. 3 exploits the difference between the secondary-beam sensitivity 404 and the minimum ablation size 402.

At the right-most side of the graph 400 (i.e., point 410 on the x-axis), the power of the main beam 106 is $P_{main}$ and the power of the secondary beam 108 is $P_{secondary}$. At the left-most side of the graph 400 (i.e., x=0.005), the power of the main beam 106 is $P_{main}/AR$ and the power of the secondary beam 108 is $P_{secondary}/AR$. At a point 406 on the x-axis, the power of the main beam 106 is $P_{main}/A1$ and the power of the secondary beam 108 is $P_{secondary}/A1$. At a point 408 on the x-axis, the power of the main beam 106 is $P_{main}/A2$ and the power of the secondary beam 108 is $P_{secondary}/A2$. The point 406 corresponds to the step 302 (FIG. 3). The point 408 corresponds to the step 304 (FIG. 3).

At the point 410 (i.e., the full-power level, which is the default power level), the secondary-beam sensitivity 404 equals 0.15, which is nearly equal to the minimum ablation size 402. At x=0.005 (i.e., at the reduced power level), however, the secondary-beam sensitivity 404 is only 0.4, which is significantly higher than the minimum ablation size at point 410. Particles with sizes in the range of approximately 0.15 to 0.4 that went through the spot 114 at the reduced-power level but then went through the spot 112 at the full-power level, due to restoration of the beam power in a single step, would not be detected using the secondary beam 108 and would be ablated. But if the beam power is partially restored only to step 302 (FIG. 3), which corresponds to point 406, then the secondary-beam sensitivity 404 is improved considerably (to just above 0.2), thereby improving the ability to detect ablation-sized particles using the secondary beam 108 during the period of the step 302. This improvement increases the likelihood of a successful secondary trigger and decreases the likelihood of particle ablation. Partially restoring the beam power further to step 304 (FIG. 3) further improves the secondary-beam sensitivity 404, thereby further increasing the likelihood of a successful secondary trigger and decreasing the likelihood of particle ablation. At point 408, the secondary beam 108 can be used to detect minimum-sized particles that would be ablated at the full-power level.

FIG. 5 is a diagram showing a laser-beam power-modulation system 500 used to generate the main beam 106 and secondary beam 108, in accordance with some embodiments. The system 500 includes a laser 502 that generates a laser beam 504. In some embodiments, the laser 502 is a green laser and the laser beam is green (e.g., has a frequency in the range of 500-565 nm). For example, the laser 502 is a mode-locked laser at 532 nm. In some embodiments, the laser 502 includes a laser cavity and a second harmonic generator (SHG) that doubles the frequency of laser light from the laser cavity. For example, the laser cavity includes an Nd:YVO4 crystal that lases at a fundamental wavelength of 1064 nm and the SHG converts the 1064 nm light to 532 nm light, resulting in the laser beam 504.

An acousto-optic modulator (AOM) 506 receives the laser beam 504 and separates the laser beam 504 into a primary beam 528 (i.e., a zeroth-order beam) and a plurality of diffracted beams 530 (e.g., +/−1 diffraction-order beams, +/−2 diffraction-order beams, etc.), based on an input signal received from a driver 514. The AOM 506 performs this separation by diffracting a portion of the laser beam 504 into the diffracted beams 530, based on the input signal from the driver 514. The power of the primary beam 528 is thus less than the power of the laser beam 504 when the AOM 506 is operating. The input signal specifies the magnitude of the diffraction performed by the AOM 506, and thereby specifies the power reduction of the primary beam 528, which corresponds to the amount of separation that is performed.

In some embodiments, the driver 514 is a radio-frequency (RF) driver and the input signal is an RF signal. The power of the primary beam 528 depends on the input signal, as does the power of the plurality of diffracted beams 530. For example, increasing the RF power of the input signal increases the diffraction performed by the AOM 506 and thereby decreases the power of the primary beam 528: more of the laser beam 504 is diffracted into the plurality of diffracted beams 530. Similarly, decreasing the RF power of the input signal decreases the diffraction performed by the AOM 506 and thereby increases the power of the primary beam 528: less of the laser beam 504 is diffracted into the plurality of diffracted beams 530.

A slit 524 acts as a filter that transmits the primary beam 528 and dumps (i.e., filters out) the plurality of diffracted beams 530. In some embodiments, the slit 524 includes a pair of mirrors with a gap between them. The gap transmits the primary beam 528 (i.e., the primary beam 528 passes through the gap), while the mirrors reflect the plurality of diffracted beams 530 to a beam dump 526.

In some embodiments, one or more mirrors direct the primary beam 528 and the plurality of diffracted beams 530 toward the slit 524. The one or more mirrors may include a first mirror (M1) 518 and a second mirror (M2) 520. The first mirror 518 reflects the primary beam 528 and the plurality of diffracted beams 530, directing them toward the second mirror 520. The second mirror 520 reflects the primary beam 528 and the plurality of diffracted beams 530, directing them toward the slit 524. The first mirror 518 and second mirror 520 are situated between the AOM 506 and the slit 524 along the optical paths of the primary beam 528 and the plurality of diffracted beams 530. The first mirror 518 is situated between the AOM 506 and the second mirror 520 along the optical paths of the primary beam 528 and the plurality of diffracted beams 530.

In some embodiments, the system 500 further includes an attenuator 508 to attenuate the primary beam 528. The attenuator 508 may also attenuate the plurality of diffracted beams 530. For example, the attenuator 508 directs some of the light from the primary beam 528 and the plurality of diffracted beams 530 to a beam dump 516. The attenuator 508 may be positioned between the AOM 506 and the one or more mirrors that direct the primary beam 528 and the plurality of diffracted beams 530 toward the slit 524. For example, the attenuator 508 is situated between the AOM 506 and the first mirror 518.

In some embodiments, a sensor 522 (e.g., a green sensor) receives light from the primary beam 528 leaked by a respective mirror of the one or more mirrors. The respective mirror reflects the primary beam 528 but is not perfect, and thus leaks (i.e., transmits) some light from the primary beam 528. For example, the respective mirror is the second mirror 520: light from the primary beam 528 leaks through the second mirror 520 and is provided to the sensor 522. The sensor 522 may include an aperture to filter out light from the plurality of diffracted beams 530 that leaks through the second mirror 520, such that the sensor 522 only senses light from the primary beam 528. The power of the light leaked by the respective mirror and sensed by the sensor 522 is related to (e.g., is a percentage of) the power of the primary beam 528. By sensing this light, the sensor 522 generates feedback indicative of the power of the primary beam 528 and provides this feedback to a controller 510.

The controller 510 (e.g., a microcontroller) generates a control signal 512 based in part on the feedback from the sensor 522. In some embodiments, the controller 510 filters noise (e.g., kilohertz-scale noise) from the feedback in the process of generating the control signal 512. The controller 510 provides the control signal 512 to the driver 514, which generates the input signal provided to the AOM 506 based on the control signal 512. For example, the control signal 512 specifies the RF power of the input signal. In some embodiments, the control signal 512 is a DC voltage ($V_{DC}$) provided to an input of the driver 514.

The primary beam 528, as transmitted by the slit 524, is provided to a harmonic generator 540, which converts a first portion of the primary beam 528 into a converted beam 542 that is a harmonic of the primary beam 528. The harmonic generator 540 also transmits a second portion 544 of the primary beam 528, because the conversion efficiency of the harmonic generator 540 is less than 100 percent. The harmonic generator 540 includes a non-linear optical crystal (e.g., a cesium-lithium-borate (CLBO) crystal). In some embodiments, the harmonic generator 540 is a fourth-harmonic generator: the frequency of the converted beam 542 may be four times the fundamental frequency of the laser beam emitted by the laser cavity in the laser 502, and twice the frequency of the primary beam 528. In some embodiments, the primary beam 528 is green and the converted beam 542 is ultraviolet (UV). For example, the primary beam 528 has a wavelength of 532 nm and the converted beam 542 has a wavelength of 266 nm.

In some embodiments, a beam-reducing telescope (BRT) 532 focuses the primary beam 528 onto the harmonic generator 540. The beam-reducing telescope 532 is situated between the slit 524 and the harmonic generator 540 in the path of the primary beam 528. The beam-reducing telescope 532 may change the shape of the beam spot for the primary beam 528 from round to elliptical. The beam-reducing telescope 532 may include a spherical lens 534 and a pair of cylindrical lenses 536 and 538, with the spherical lens 534 closest to the slit 524.

Because the converted beam 542 is a harmonic of the primary beam 528, it has a different frequency than the primary beam 528, and thus a different frequency than the second portion 544 of the primary beam 528. A frequency separator 546 receives the converted beam 542 and the second portion 544 of the primary beam, transmits the converted beam 542, and dumps the second portion 544 of the primary beam.

In some embodiments, a sensor 560 (e.g., a UV sensor) receives light from the converted beam 542 that is leaked by the frequency separator 546. The power of the light leaked by the frequency separator 546 and sensed by the sensor 560 is related to (e.g., is a percentage of) the power of the converted beam 542. By sensing this light, the sensor 560 generates feedback indicative of the power of the converted beam 542 and provides this feedback to the controller 510. The controller 510 may generate the control signal 512 based in part on the feedback from the sensor 560. For example, the controller 510 may generate the control signal 512 using the feedback from both the sensor 560 and the sensor 522, or may generate the control signal 512 using the feedback from the sensor 560 but not the feedback from the sensor 522. Alternatively, the controller 510 may generate the control signal 512 using the feedback from the sensor 522 but not the feedback from the sensor 560. In some embodiments, the controller 510 filters noise (e.g., kilohertz-scale noise) from the feedback from the sensor 560 and/or the sensor 522 in the process of generating the control signal 512.

In addition to receiving feedback from the sensors 560 and/or 522, the controller 510 receives the signal 140 from the PMT or PMT array 138 (FIG. 1) (or from another detector). The controller 510 may generate the control signal 512 using the signal 140, in addition to or instead of the feedback from the sensors 560 and/or 522. For example, the controller 510 may generate a control signal 512 that causes the primary beam 528 to be modulated in a controlled manner as shown in FIG. 3, in response to assertion of the signal 140.

In some embodiments, the frequency separator 546 includes a Pellin-Broca prism 550, a third mirror (M3) 552, and a fourth mirror (M4) 556. The third mirror 552 is situated between the Pellin-Broca prism 550 and the fourth mirror 556 in the beam path of the converted beam 542. The Pellin-Broca prism 550 spatially separates the converted beam 542 from the second portion 544 of the primary beam. Also, the front surface of the Pellin-Broca prism 550 reflects part of the second portion 544 of the primary beam, directing it to a beam dump 548. The third mirror 552, which is dichroic, reflects the converted beam 542 while transmitting the second portion 544 of the primary beam to a beam dump 554, thereby dumping the second portion 544 of the primary beam.

By reflecting the converted beam 542, the third mirror 552 directs the converted beam 542 to the fourth mirror 556, which reflects the converted beam 542 and thereby transmits the converted beam 542 beyond the frequency separator 546. The third mirror 552 may also reflect some of (e.g., <5% of) the second portion 544 of the primary beam on a spatially separate path to the fourth mirror 556. The fourth mirror 556, which may also be dichroic, reflects some of (e.g., <5% of) this light from the second portion of the primary beam, directing it to a beam dump 558. The frequency separator 546 thus substantially dumps the second portion 544 of the primary beam (e.g., the green light that was not converted to UV by the harmonic generator 540) while transmitting the converted beam 542 (e.g., the UV light generated by the harmonic generator 540).

The converted beam 542, as transmitted by the frequency separator 546, is provided to the DOE 104 (or another beam splitter), which splits the converted beam 542 into the main beam 106 and the secondary beam 108. The converted beam 542 is an example of the third beam 102 (FIG. 1).

In some embodiments, the controller 510 includes processor circuitry and may include embedded non-volatile memory that stores instructions (e.g., one or more programs) for execution by the processor circuitry. For example, the controller 510 may be a microcontroller with embedded flash memory or other non-volatile memory. Alternatively, the controller is coupled to separate non-volatile memory that stores instructions for execution by the processor circuitry. The non-volatile memory, whether embedded in or coupled to the controller 510, is an example of a non-transitory computer-readable storage medium. The instructions, when executed by the processing circuitry, cause the controller 510 to implement the functions described for the controller 510 herein (e.g., generating the control signal 512). In some embodiments, the controller 510 includes a filter (e.g., an analog filter, such as an RC filter) that may be selectively connected to the driver 514 in response to assertion of the signal 140 (e.g., a preset period of time after assertion of the signal 140) to allow the power of the primary beam 528 (and thus the power of the converted beam 542) to be ramped up in a substantially smooth curve (e.g., curve 308 or 312, FIG. 3).

In some embodiments, a different type of modulator instead of the AOM 506 is used to modulate the primary beam 528. For example, a Pockels cell may be used.

Figure 6:
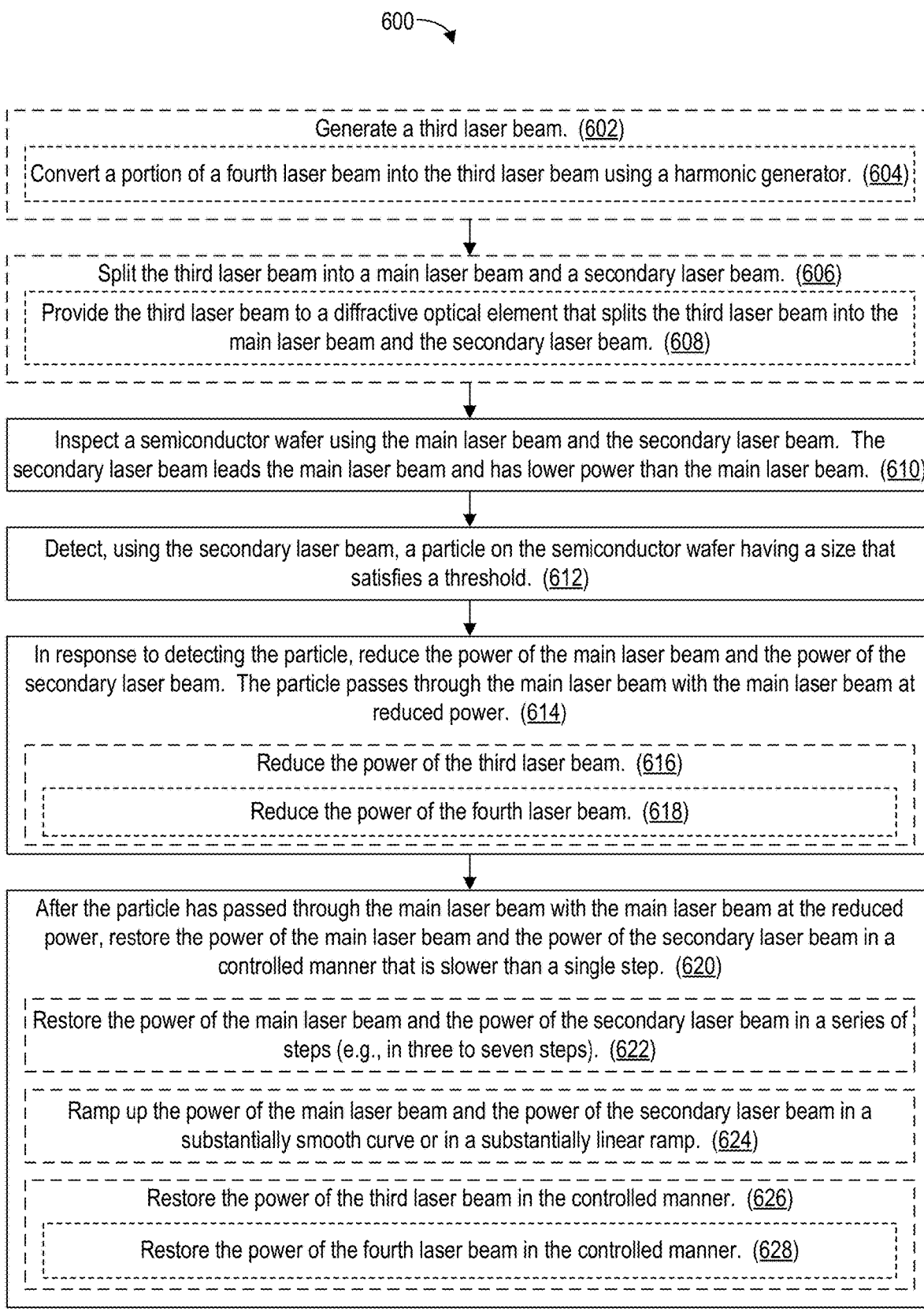
FIG. 6 is a flowchart of a method of modulating the power of a main laser beam and a secondary laser beam while inspecting a semiconductor wafer, to avoid large-particle ablation, in accordance with some embodiments.

FIG. 6 is a flowchart of a method 600 of modulating the power of a main laser beam (e.g., main beam 106, FIGS. 1 and 5) and a secondary laser beam (e.g., secondary beam 108, FIGS. 1 and 5) while inspecting a semiconductor wafer (e.g., wafer 116, FIG. 1), to avoid large-particle ablation, in accordance with some embodiments.

In some embodiments of the method 300, a third laser beam (e.g., third beam 102, FIG. 1; converted beam 542, FIG. 5) is generated (602). For example, a portion of a fourth laser beam (e.g., primary beam 528, FIG. 5) is converted (604) into the third laser beam using a harmonic generator (e.g., harmonic generator 540, FIG. 5), such that the third laser beam is a harmonic of the fourth laser beam. The third laser beam is split (606) into the main laser beam and the secondary laser beam. For example, the third laser beam is provided (608) to a diffractive optical element (e.g., DOE 104, FIGS. 1 and 5) that splits the third laser beam into the main laser beam and the secondary laser beam.

The semiconductor wafer is inspected (610) using the main laser beam and the secondary laser beam. The secondary laser beam leads the main laser beam (e.g., by a distance d, FIG. 3) and has lower power than the main laser beam.

Using the secondary laser beam, a particle (e.g., particle 118, FIGS. 1, 3, and 5) is detected (612) on the semiconductor wafer having a size that satisfies a threshold (i.e., the size of the particle exceeds, or equals or exceeds, the threshold).

In response to detecting the particle, the power of the main laser beam and the power of the secondary laser beam are reduced (614). For example, the power of the main laser beam and the power of the secondary laser beam are reduced in a single step, as shown in FIG. 3. The particle passes through the main laser beam with the main laser beam at reduced power (e.g., at a reduced power level $P_{main}/AR$).

In some embodiments, to reduce the power of the main laser beam and the power of the secondary laser beam, the power of the third laser beam is reduced (616). For example, the power of the fourth laser beam is reduced (618), thereby reducing the power of the third laser beam and thus the power of the main laser beam and the power of the secondary laser beam. A signal (e.g., signal 140, FIGS. 1 and 5) may be asserted in response to detecting the particle. The power of the fourth laser beam may be reduced in response to assertion of the signal. If an AOM (e.g., AOM 506, FIG. 5) in the path of the fourth laser beam is used to modulate the power of the fourth laser beam, then the power of the fourth laser beam may be reduced by increasing RF power provided to the AOM (e.g., by the driver 514, as controlled by the controller 510, FIG. 5).

After the particle has passed through the main laser beam with the main laser beam at the reduced power, the power of the main laser beam and the power of the secondary laser beam are restored (620) in a controlled manner that is slower than a single step. In some embodiments, the power of the main laser beam and the power of the secondary laser beam are restored (622) in a series of steps (e.g., steps 302, 304, and 306, FIG. 3). For example, the series of steps may include three to seven steps (e.g., five to seven steps). In some other embodiments, the power of the main laser beam and the power of the secondary laser beam are ramped up (624) in a substantially smooth curve (e.g., curve 308 or 312, FIG. 3) or in a substantially linear ramp (e.g., substantially linear ramp 310, FIG. 3).

In some embodiments, to restore the power of the main laser beam and the power of the secondary laser beam, the power of the third laser beam is restored (626) in the controlled manner. For example, the third laser beam may be restored in a series of steps (e.g., in three to seven steps) (e.g., in five to seven steps). In another example, the power of the third laser beam is ramped up in a substantially smooth curve or in a substantially linear ramp.

In some embodiments, to restore the power of the third laser beam, the power of the fourth laser beam is restored (628) in the controlled manner. For example, the fourth laser beam may be restored in a series of steps (e.g., in three to seven steps) (e.g., in five to seven steps) (e.g., in at least three steps or at least five steps). In another example, the power of the fourth laser beam is ramped up in a substantially smooth curve or in a substantially linear ramp. The power of the fourth laser beam may be restored by reducing the RF power provided to the AOM (i.e., reducing the RF power with respect to the increased RF power used to reduce the power of the fourth laser beam), in accordance with some embodiments. For example, the RF power provided to the AOM may be reduced to restore it to its level preceding the reduction, in step 618, of the power of the fourth laser beam.

While the method 600 includes a number of operations that appear to occur in a specific order, the method 600 can include more or fewer operations. Two or more operations may be combined into a single operation. Performance of two or more operations may overlap. For example, the inspection operation 610 may be performed on a continuous basis while other operations in the method 600 are performed.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A method, comprising:
  inspecting a semiconductor wafer using a main laser beam and a secondary laser beam, wherein the secondary laser beam leads the main laser beam and has lower power than the main laser beam;
  detecting, using the secondary laser beam, a particle on the semiconductor wafer having a size that satisfies a threshold;
  in response to detecting the particle, reducing the power of the main laser beam and the power of the secondary laser beam, wherein the particle passes through the main laser beam with the main laser beam at reduced power; and
  after the particle has passed through the main laser beam with the main laser beam at the reduced power, restoring the power of the main laser beam and the power of the secondary laser beam in a controlled manner that is slower than a single step.

2. The method of claim 1, wherein restoring the power of the main laser beam and the power of the secondary laser beam in the controlled manner comprises restoring the power of the main laser beam and the power of the secondary laser beam in a series of steps.

3. The method of claim 2, wherein the series of steps consists of three to seven steps.

4. The method of claim 2, wherein the series of steps comprises at least three steps.

5. The method of claim 1, wherein restoring the power of the main laser beam and the power of the secondary laser beam in the controlled manner comprises ramping up the power of the main laser beam and the power of the secondary laser beam in a substantially smooth curve.

6. The method of claim 1, wherein restoring the power of the main laser beam and the power of the secondary laser beam in the controlled manner comprises ramping up the power of the main laser beam and the power of the secondary laser beam in a substantially linear ramp.

7. The method of claim 1, further comprising splitting a third laser beam into the main laser beam and the secondary laser beam, wherein:
  reducing the power of the main laser beam and the power of the secondary laser beam comprises reducing the power of the third laser beam; and
  restoring the power of the main laser beam and the power of the secondary laser beam in the controlled manner comprises restoring the power of the third laser beam in the controlled manner.

8. The method of claim 7, wherein splitting the third laser beam comprises providing the third laser beam to a diffractive optical element that splits the third laser beam into the main laser beam and the secondary laser beam.

9. The method of claim 7, further comprising generating the third laser beam, wherein generating the third laser beam comprises converting a portion of a fourth laser beam into the third laser beam using a harmonic generator, the third laser beam being a harmonic of the fourth laser beam.

10. The method of claim 9, wherein:
  reducing the power of the third laser beam comprises reducing the power of the fourth laser beam; and
  restoring the power of the third laser beam in the controlled manner comprises restoring the power of the fourth laser beam in the controlled manner.

11. The method of claim 10, wherein restoring the power of the fourth laser beam in the controlled manner comprises restoring the power of the fourth laser beam in a series of steps.

12. The method of claim 11, wherein the series of steps consists of three to seven steps.

13. The method of claim 11, wherein the series of steps comprises at least three steps.

14. The method of claim 10, wherein restoring the power of the fourth laser beam in the controlled manner comprises ramping up the power of the fourth laser beam in a substantially smooth curve.

15. The method of claim 10, wherein restoring the power of the fourth laser beam in the controlled manner comprises ramping up the power of the fourth laser beam in a substantially linear ramp.

16. The method of claim 10, further comprising asserting a signal in response to detecting the particle, wherein:
reducing the power of the fourth laser beam comprises increasing radio-frequency (RF) power provided to an acousto-optic modulator (AOM) in the path of the fourth laser beam; and
restoring the power of the fourth laser beam in the controlled manner comprises reducing the RF power provided to the AOM.

17. A system, comprising:
optics to provide a main laser beam and a secondary laser beam to a semiconductor wafer, wherein the secondary laser beam is to lead the main laser beam and has lower power than the main laser beam; and
a detector to detect, using the secondary laser beam, a particle on the semiconductor wafer having a size that satisfies a threshold;
wherein the optics comprise a modulator to cause, in response to detecting the particle:
the power of the main laser beam and the power of the secondary laser beam to be reduced when the particle passes through the main laser beam, and
the power of the main laser beam and the power of the secondary laser beam to be restored in a controlled manner that is slower than a single step after the particle has passed through the main laser beam.

18. The system of claim 17, wherein the modulator is to restore the power of the main laser beam and the power of the secondary laser beam in a series of steps.

19. The system of claim 18, wherein the series of steps consists of three to seven steps.

20. The system of claim 18, wherein the series of steps comprises at least three steps.

21. The system of claim 17, wherein the modulator is to restore the power of the main laser beam and the power of the secondary laser beam by ramping up the power of the main laser beam and the power of the secondary laser beam in a substantially smooth curve.

22. The system of claim 17, wherein the modulator is to restore the power of the main laser beam and the power of the secondary laser beam in a substantially linear ramp.

23. The system of claim 17, wherein:
the detector is to assert a signal in response to detecting the particle; and
the system further comprises a controller to receive the signal, wherein:
in response to assertion of the signal, the controller is to cause the power of the main laser beam and the power of the secondary laser beam to be reduced when the particle passes through the main laser beam; and
the controller is to cause the power of the main laser beam and the power of the secondary laser beam to be restored in the controlled manner after the particle has passed through the main laser beam.

24. The system of claim 23, further comprising a beam splitter to split a third laser beam into the main laser beam and the secondary laser beam, wherein:
in response to assertion of the signal, the controller is to cause the power of the third laser beam to be reduced when the particle passes through the main laser beam; and
the controller is to cause the power of the third laser beam to be restored in the controlled manner after the particle has passed through the main laser beam.

25. The system of claim 24, wherein the beam splitter comprises a diffractive optical element.

26. The system of claim 24, further comprising a harmonic generator to convert a portion of a fourth laser beam into the third laser beam, the third laser beam being a harmonic of the fourth laser beam, wherein:
in response to assertion of the signal, the controller is to cause the power of the fourth laser beam to be reduced when the particle passes through the main laser beam; and
the controller is to cause the power of the fourth laser beam to be restored in the controlled manner after the particle has passed through the main laser beam.

27. The system of claim 26, wherein:
the modulator is an acousto-optic modulator (AOM);
the system further comprises a radio-frequency (RF) driver, coupled between the controller and the AOM, to provide RF power to the AOM;
in response to assertion of the signal, the controller is to cause the power of the fourth laser beam to be reduced when the particle passes through the main laser beam by causing the RF driver to increase the RF power provided to the AOM when the particle passes through the main laser beam; and
the controller is to cause the power of the fourth laser beam to be restored in the controlled manner after the particle has passed through the main laser beam by causing the RF driver to reduce the RF power provided to the AOM after the particle has passed through the main laser beam.

28. The system of claim 27, wherein the controller is to cause the power of the fourth laser beam to be restored in a series of steps.

29. The system of claim 28, wherein the series of steps consists of three to seven steps.

30. The system of claim 28, wherein the series of steps comprises at least three steps.

31. The system of claim 27, wherein the controller is to cause the power of the fourth laser beam to be restored in a substantially smooth curve.

32. The system of claim 27, wherein the controller is to cause the power of the fourth laser beam to be restored in a substantially linear ramp.

* * * * *